United States Patent [19]

Ootaki et al.

[11] Patent Number: 5,643,827
[45] Date of Patent: Jul. 1, 1997

[54] GAP LIGHT EMITTING SUBSTRATE AND A METHOD OF MANUFACTURING IT

[75] Inventors: Toshio Ootaki, Takasaki; Akio Nakamura; Yuuki Tamura, both of Annaka; Munehisa Yanagisawa, Takasaki; Susumu Higuchi, Annaka, all of Japan

[73] Assignee: Shin-Etsu Handotai Kabushiki Kaisha, Tokyo, Japan

[21] Appl. No.: 358,977

[22] Filed: Dec. 19, 1994

Related U.S. Application Data

[62] Division of Ser. No. 128,131, Sep. 29, 1993, abandoned.

[30] Foreign Application Priority Data

Sep. 30, 1992 [JP] Japan ................................ 4-285265

[51] Int. Cl.$^6$ ................................ H01L 21/20
[52] U.S. Cl. ................ 437/127; 437/129; 437/96
[58] Field of Search .................... 257/86, 87; 437/127, 437/129, 96

[56] References Cited

U.S. PATENT DOCUMENTS

| | | | |
|---|---|---|---|
| 3,189,494 | 6/1965 | Short | 437/96 |
| 3,872,314 | 3/1975 | Peaker et al. | |
| 3,931,631 | 1/1976 | Groves et al. | 257/87 |
| 4,101,920 | 7/1978 | Nagasawa et al. | 257/87 |
| 4,417,262 | 11/1983 | Iwamoto et al. | 257/87 |

FOREIGN PATENT DOCUMENTS

| | | | |
|---|---|---|---|
| 54-133093 | 10/1979 | Japan | |
| 94678 | 7/1981 | Japan | 437/130 |
| 2-18319 | 4/1990 | Japan | |

*Primary Examiner*—Robert Kunemund
*Attorney, Agent, or Firm*—Ronald R. Snider

[57] ABSTRACT

A GaP light emitting element substrate comprising an n-type GaP layer, a nitrogen-doped n-type GaP layer and a p-type GaP layer layered one after another on a multi-layer GaP substrate built by forming an n-type GaP buffer layer(s) on an n-type GaP single crystal substrate, wherein the sulfur (S) concentration in said n-type GaP buffer layer is made to be $5 \times 10^{16}$ [atoms/cc] or less. The method of manufacturing it is as follows: an n-type GaP buffer layer(s) is formed on an n-type GaP single crystal substrate to prepare a multi-layer GaP substrate, then an n-type GaP layer, a nitrogen doped n-type GaP layer and a p-type GaP layer are layered on said multi-layer GaP substrate by means of the melt-back method to obtain a GaP light emitting element substrate, wherein the sulfur (S) concentration in said n-type GaP buffer layer is made to be $5 \times 10^{16}$ [atoms/cc] or less when the multi-layer GaP substrate is prepared.

2 Claims, 5 Drawing Sheets

GAP LIGHT EMITTING SUBSTRATE AND A METHOD OF MANUFACTURING IT

This application is a divisional of application Ser. No. 08/128,131, filed Sep. 29, 1993 now abandoned.

BACKGROUND OF THE INVENTION

1 Field of the Invention

This invention relates to a GaP light emitting element substrate and a method of manufacturing it, and more specifically to a GaP light emitting element substrate comprising a substrate with a plurality of GaP layers on it which is used when manufacturing GaP light emitting diodes which emit green light, and a method of manufacturing it.

2. Prior Art

Light emitting elements such as light emitting diodes are obtained normally by layering a plurality of semiconductor layers on a semiconductor substrate to prepare a multi-layer semiconductor substrate with a pn junction(s), and making it into elements. Of these, green light emitting diodes can be obtained by using a light emitting element substrate prepared by forming one or more layers of both n-type and p-type GaP layers, one after another, on an n-type GaP single crystal substrate.

GaP is an indirect transition type semiconductor, and therefore the brightness is very low when a pn junction is simply formed. Therefore nitrogen (N), which would be the luminescence center, is added to the n-type GaP layer in the proximity of the pn junction to increase the light emitting output.

A light emitting diode prepared from the GaP light emitting element substrate which has the nitrogen-doped n-type GaP layer, as described above, will produce a yellow-green light emission with a peak wavelength of about 567 nm.

FIG. 1 shows an example of the cross-sectional structure of a GaP light emitting element substrate which produces a green light emission. For this light emitting element substrate, an n-type GaP buffer layer 11, an n-type GaP layer 12, a nitrogen-doped n-type GaP layer 13 and a p-type GaP layer 14 are formed one after another on an n-type GaP single crystal substrate 10.

For the method of forming each GaP layer on the n-type GaP single crystal substrate 10, the liquid phase epitaxial growth method, for example, can be used. For the liquid phase epitaxial growth, two methods are normally employed.

In the first liquid phase epitaxial growth method, for example, a Ga solution prepared by dissolving GaP polycrystals in fused Ga at 1060° C. is placed on a GaP substrate, and the GaP layer is grown by gradually lowering the temperature to precipitate GaP in the Ga solution on the GaP substrate.

In the other liquid phase epitaxial growth method (hereafter referred to as melt-back liquid epitaxial growth method or melt-back method for short), fused Ga is placed on a GaP substrate, and then, for example, the temperature is raised to 1060° C. so that the upper portion of the GaP substrate is dissolved into the fused Ga to prepare the Ga solution, and then the GaP layer is grown by gradually lowering the temperature to precipitate GaP in the Ga solution on the GaP substrate.

Recently, the progress of GaP light emitting diodes which emit yellow-green light has been remarkable, and each year diodes with higher light emission outputs are developed.

Along with this trend toward higher light emission output, the application range of the GaP light emitting diodes has spread to a wider range. However, development of light emitting diodes with even higher light emission outputs is desirable in order to further expand the application range.

In order to obtain a light emitting element substrate for manufacturing light emitting elements with high light emission outputs, it has become common, as described, for example, in Japanese examined patent publication (Tokko) Hei-2-18319, to prepare a multi-layer GaP substrate and use it when growing the GaP layer with the melt-back method as described above. In this method, a multi-layer GaP substrate is previously prepared by forming an n-type GaP buffer layer 11 on an n-type GaP single crystal substrate 10, and, for the next step, the melt-back method is used to dissolve the upper portion of the n-type GaP buffer layer 11 on said multi-layer GaP substrate, then GaP is precipitated again to form the n-type GaP layer 12, the nitrogen-doped n-type GaP layer 13 and the p-type GaP layer 14, one after another.

SUMMARY OF THE INVENTION

However, when the method described above is used, and if sulfur (S), which is generally used as an n-type dopant, is involved, then there is a problem in that the higher light emission output cannot be achieved because of the effect of S.

For example, during the formation of the n-type GaP buffer layer 11, if the S concentration in the n-type GaP buffer layer 11 exceeds $5 \times 10^{16}$ [atoms/cc], then the light emission output of the light emitting diodes, made from this light emitting element substrate, drops sharply.

Therefore, the object of this invention is to provide a GaP light emitting element substrate which contains a nitrogen-doped n-type GaP layer with a sufficiently low concentration of sulfur as an n-type dopant, and produces a high light emission output, as well as a method of manufacturing it.

The GaP light emitting element substrate of this invention comprises an n-type GaP layer, a nitrogen-doped n-type GaP layer and a p-type GaP layer layered one after another on a multi-layer GaP substrate built by forming an n-type GaP buffer layer(s) on an n-type GaP single crystal substrate, wherein the sulfur (S) concentration in said n-type GaP buffer layer is made $5 \times 10^{16}$ [atoms/cc] or less.

In order to meet the standards for the forward direction voltage of the green light emitting GaP light emitting diodes in operation (normally 2.30 V or lower at 20 mA), it is necessary to keep the n-type dopant concentration in said n-type GaP buffer layer at 11 at $5 \times 10^{16}$ [atoms/cc] or higher. Therefore, it is desirable to dope said GaP buffer layer with another n-type dopant(s) in addition to S so that the n-type dopant concentration in the n-type GaP buffer layer is $5 \times 10^{16} – 3 \times 10^{17}$ [atoms/cc]. For this other n-type dopant used for doping along with S, tellurium (Te) would be an example.

Even when the doping with S as an n-type dopant is not conducted intentionally, the n-type GaP buffer layer is naturally doped with S which comes from sulfur or sulfur compounds contained in the environment or in the raw materials. The concentration is about $5 \times 10^{16}$ [atoms/cc] or lower when the doping sources (contamination sources) mentioned above are kept out as much as possible.

In the method of manufacturing a GaP light emitting element substrate of this invention, an n-type GaP buffer layer(s) is formed on an n-type GaP single crystal substrate to prepare a multi-layer GaP substrate, then an n-type GaP layer, a nitrogen doped n-type GaP layer and a p-type GaP layer are layered on said multi-layer GaP substrate by means of the melt-back method, wherein the sulfur (S) concentration in said n-type GaP buffer layer is made to be $5\times10^{16}$ [atoms/cc] or less.

In order to increase the light emission output of a green light emitting GaP light emitting diode, it is necessary to keep the effective donor concentration [(donor concentration (ND))–(Acceptor concentration (NA))] in the nitrogen-doped n-type GaP layer (i.e. the light emitting area) lower ($2\times10^{16}$ [atoms/cc] or less]. Since NA, mentioned above, is usually in the range of $1\times10^{16}$ [atoms/cc], the corresponding ND would be $3\times10^{16}$ [atoms/cc] or less.

The inventors found out that, in the method of manufacturing a light emitting element substrate by using the melt-back method to layer a plurality of GaP layers on a multi-layer GaP substrate obtained by forming an n-type buffer layer on an n-type GaP single crystal substrate, the n-type dopant S contained in the n-type GaP buffer layer is transferred, without a significant reduction in the concentration (approximately down to ½), to the nitrogen-doped n-type GaP layer which is grown by the melt-back method. On the other hand, in the case of other dopants, Te for example, the Te concentration in the nitrogen-doped n-type GaP layer after the process described above is reduced to about 1/50 of the Te concentration in the n-type GaP buffer layer.

We also discovered that, in order to make the effective donor concentration [ND–NA] in the nitrogen-doped GaP layer, which is the light emission region, $2\times10^{16}$ [atoms/cc] or less (ND would be $3\times10^{16}$ [atoms/cc] or less), and thus manufacture a light emitting element substrate with a high light emission output, it is necessary to make the S concentration in the n-type GaP buffer layer $5\times10^{16}$ [atoms/cc] or less so that the total concentration of the n-type dopants is $5\times10^{16}$–$3\times10^{17}$ [atoms/cc].

BRIEF DESCRIPTION OF THE DRAWINGS

A cross-sectional view of an example of a cross-sectional structure of a GaP light emitting element substrate.

DETAILED DESCRIPTION OF THE PREFERRED EMBODIMENTS

An example of the method of manufacturing a GaP light emitting element substrate of this invention is described next, by referring to the process diagram shown in FIG. 2.

Figure 1:
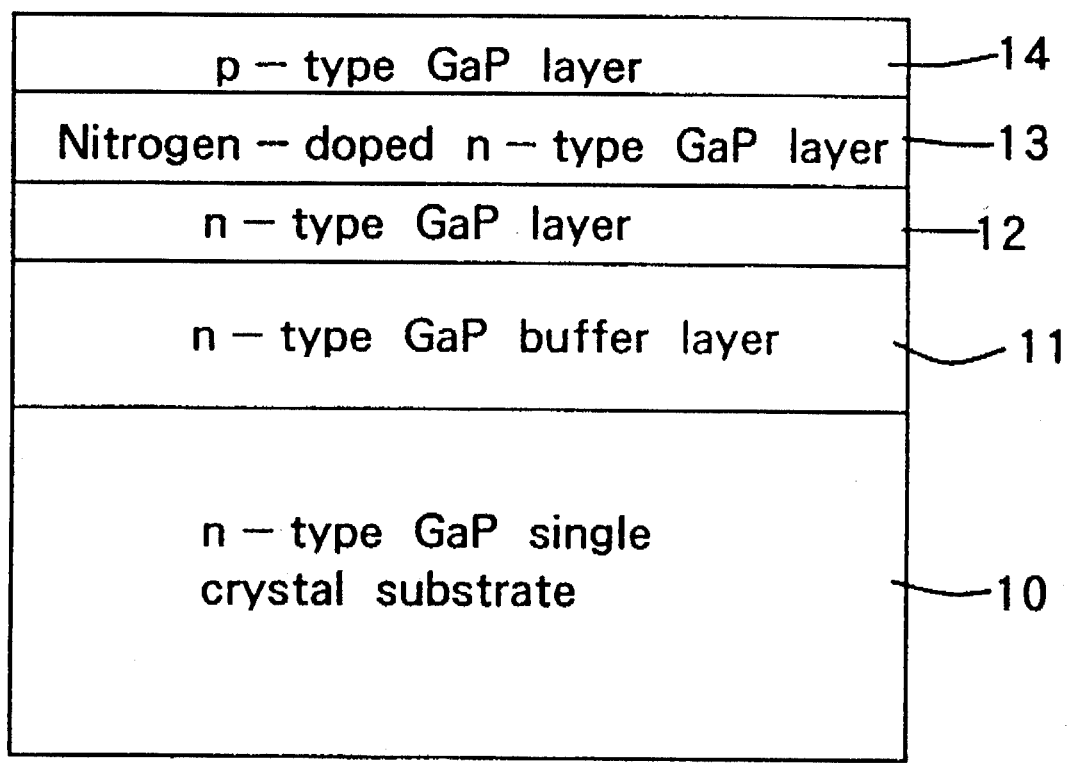
FIG. 1 shows a light emitting substrate in the prior art.
Figure 2:
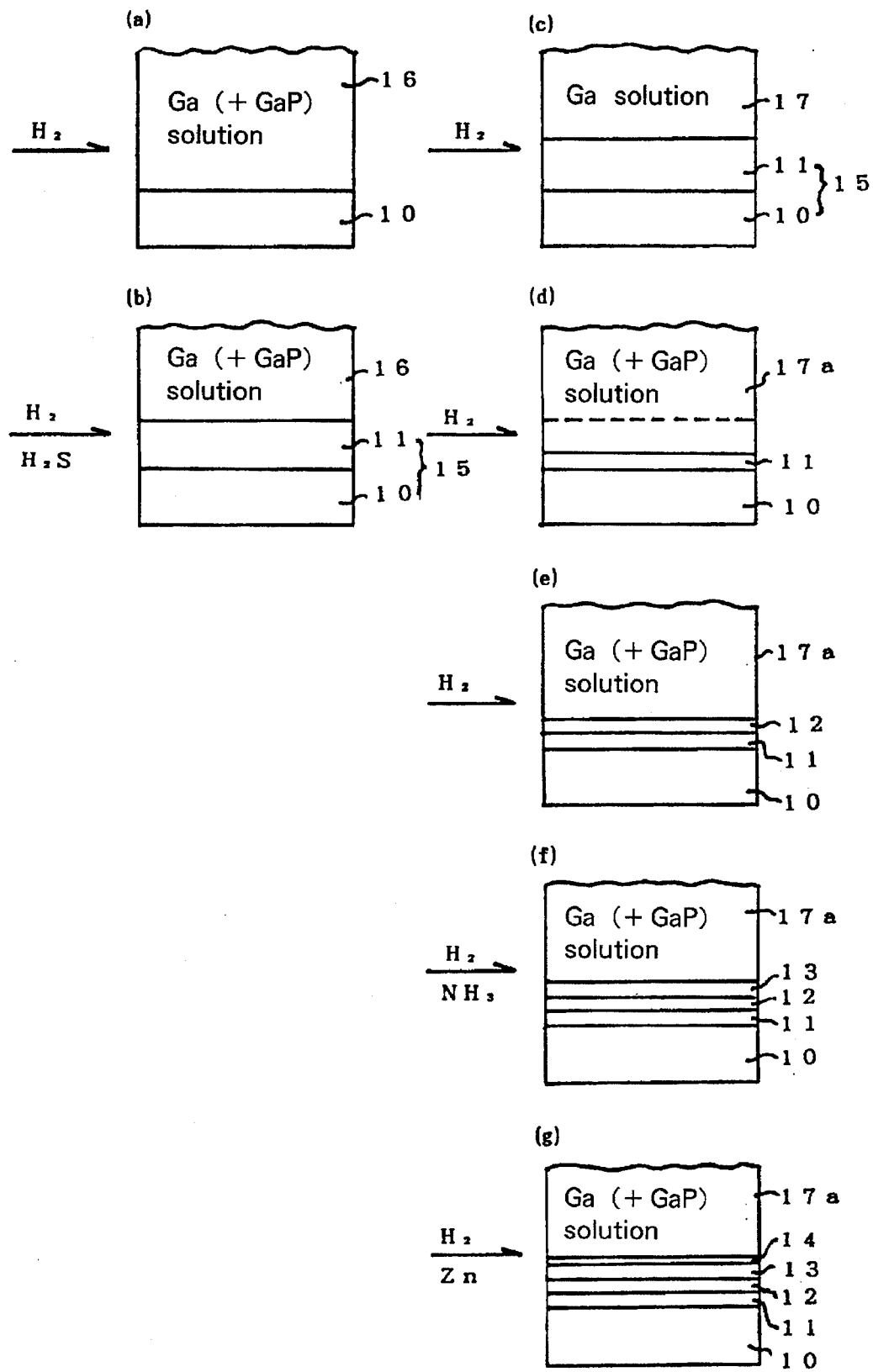
FIGS. 2a to 2g show a process diagram which shows an example of the GaP layer growth method in the method of manufacturing the GaP light emitting element substrate of this invention.

First, as shown in FIG. 2 (a), a Ga solution 16 at 1060° C. into which GaP poly-crystals and Te, which is going to be an n-type dopant, are dissolved is placed on a GaP single crystal substrate 10. This Ga solution 16 is a GaP saturated solution at 1060° C. into which Te is added in such a way that the total n-type dopant concentration in the n-type GaP buffer layer 11, which will be described later, becomes $5\times10^{16}$–$3\times10^{17}$ [atoms/cc].

Then, the temperature of the system which includes said Ga solution 16 is gradually lowered in the presence of the flow of hydrogen sulfide ($H_2S$), which is going to be an n-type dopant, and the carrier gas, hydrogen ($H_2$), so that GaP dissolved in the Ga solution 16 precipitates on the n-type GaP single crystal substrate 10. Thus, the multi-layer GaP substrate 15 comprising the GaP buffer layer 11 doped with Te and S formed on the n-type GaP single crystal substrate 10 is obtained (FIG. 2 (b)).

Next, as shown in FIG. 2 (c), fused Ga 17 without an n-type dopant is placed on said multi-layer GaP substrate 15. At this time, the temperature is set at 600° C.

Then, the temperature of the system which contains said fused Ga 17 is raised to 1000° C. The upper portion of the n-type GaP buffer layer 11 gradually dissolves into fused Ga 17, and this fused Ga becomes a saturated solution of GaP at 1000° C. (Ga solution 17a). Here, Te and S which are contained in the n-type GaP buffer layer 11 also dissolve in said Ga solution 17a (FIG. 2 (d)).

Next, the temperature is lowered to grow the n-type GaP layer 12 doped with the n-type dopants (Te and S) (FIG. 2 (e)), and, in the presence of the flow of $NH_3$ along with the carrier gas $H_2$ in said system, the temperature is further lowered to grow the nitrogen-doped n-type GaP layer 13 which is doped with nitrogen (N) and the n-typed dopants (Te and S) on the n-type GaP layer 12 (FIG. 2 (f)).

Then, the $NH_3$ flow is stopped, the temperature of the system, to which Zn is added here, is raised to about 700° C., and then the temperature is lowered. Thus Zn vapor flows along with the carrier gas $H_2$, and the p-type GaP layer 14 doped with Zn is formed on the nitrogen-doped n-type GaP layer 13 (FIG. (g)).

In the manner described above, the n-type GaP buffer layer 11, the n-type GaP layer 12, the nitrogen-doped n-type GaP layer 13 and the p-type GaP layer 14 are formed one after another on the n-type GaP single crystal substrate 10 to prepare the light emitting element substrate, and this light emitting element substrate is made into elements to obtain light emitting diodes with preen light emission.

Figure 3:
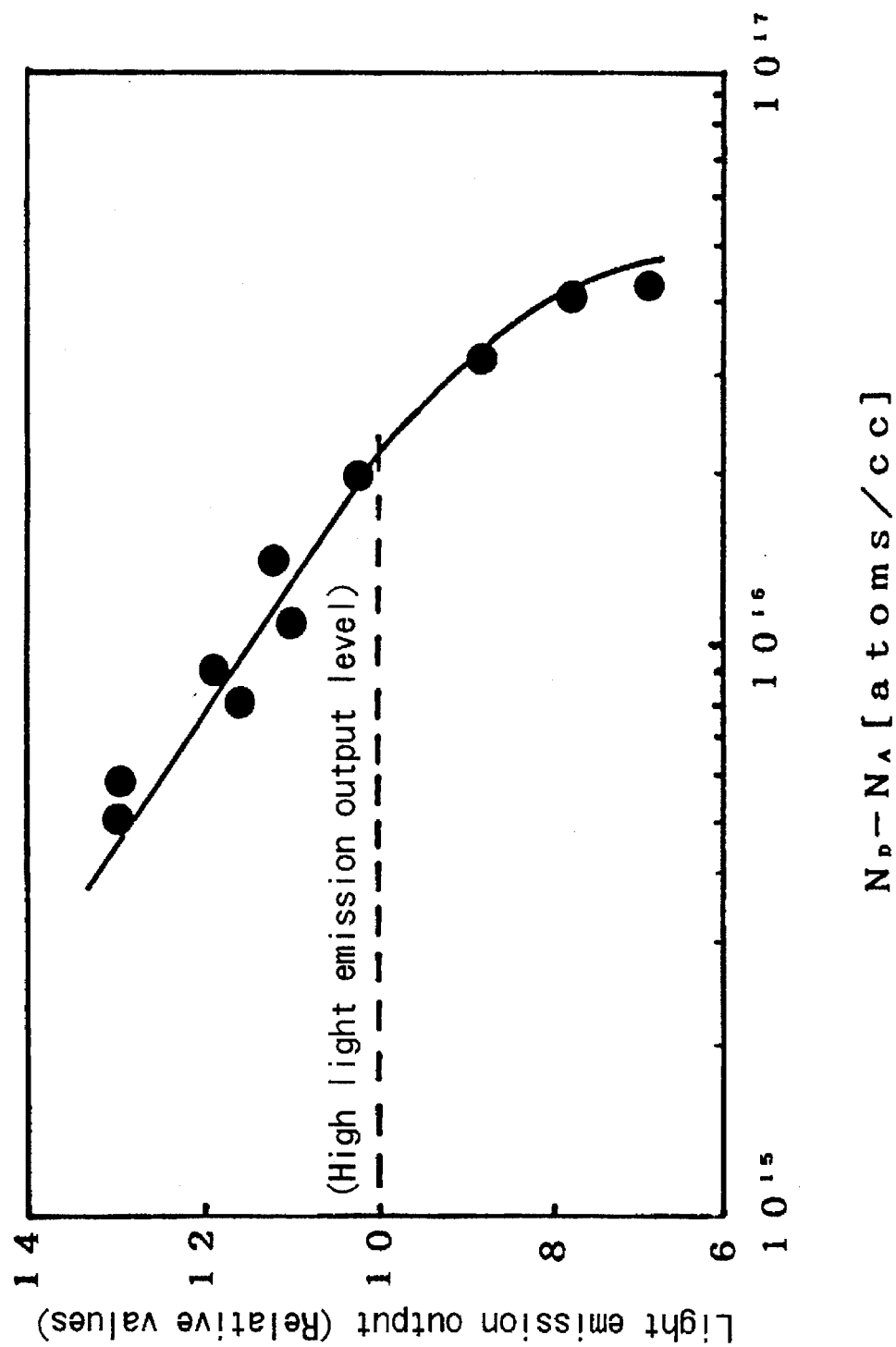
FIG. 3 shows the relationship between the light emission output (relative values) of the light emitting diodes and the effective donor concentrations when the GaP light emitting element substrates from which these light emitting diodes are made are prepared with various effective donor concentrations in the nitrogen-doped n-type GaP layer (light emission region).

FIG. 3 shows the relationship between the light emission output (relative values) of the light emitting diodes and the effective donor concentrations when the GaP light emitting element substrates from which these light emitting diodes are made are prepared with various effective donor concentrations [ND–NA] in the nitrogen-doped n-type GaP layer 13 (light emitting area). As shown in the figure, in order to obtain a green light emitting GaP light emitting diode with a high light emission output (light emission output (relative value) of 10 or more), it is necessary to make the effective donor concentration in said nitrogen-doped n-type GaP layer $2\times10^{16}$ [atoms/cc] or lower (corresponding to ND of $3\times10^{16}$ [atoms/cc] or lower).

Figure 4:
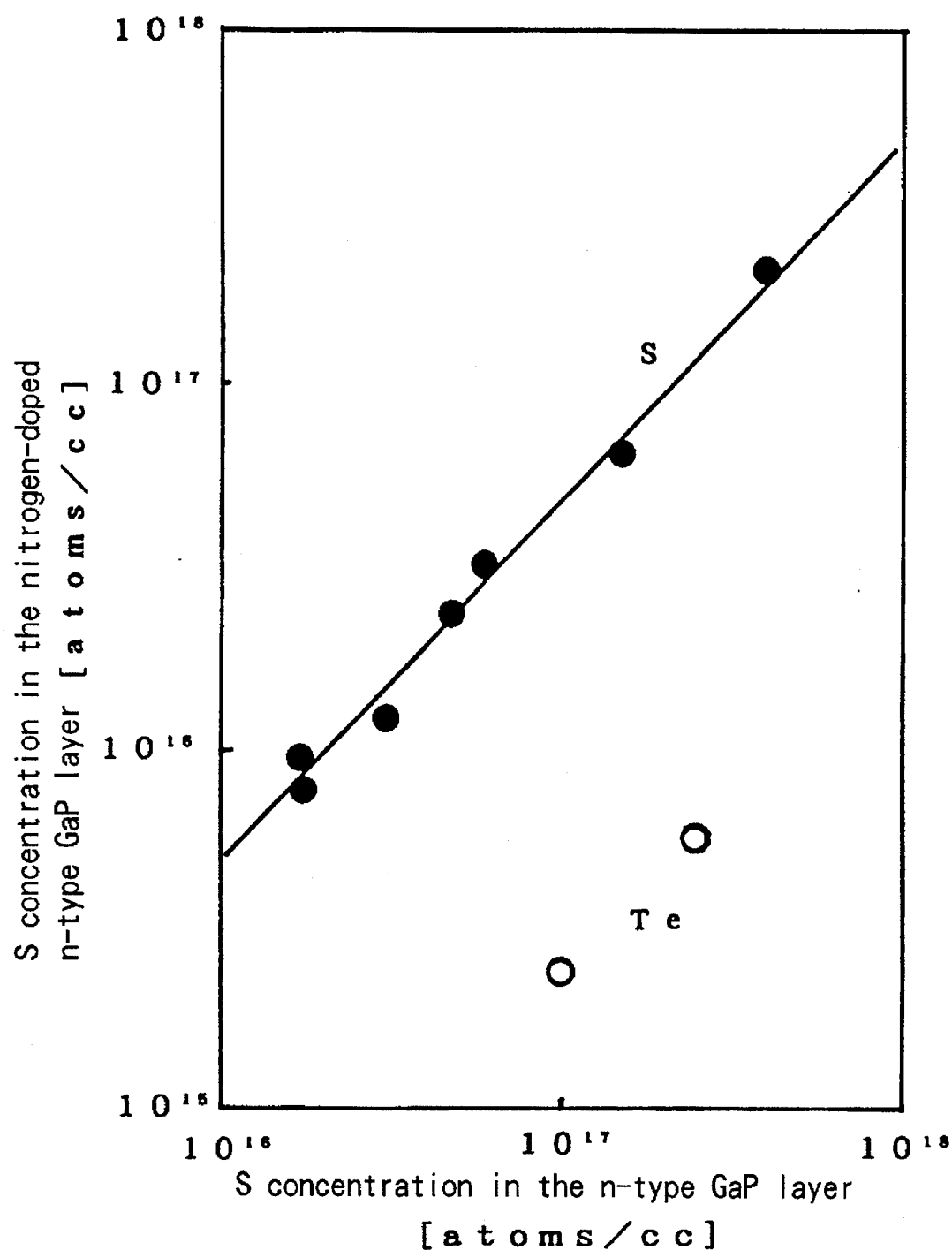
FIG. 4 shows the relationship between the S concentration in the nitrogen-doped n-type layer and the S concentration in the n-type GaP buffer layer when the light emitting element substrates are manufactured with the melt-back method by using said multi-layer GaP substrates with various S concentrations in the n-type GaP buffer layers.

FIG. 4 shows the relationship between the S concentration in the nitrogen-doped n-type GaP layer 13 and the S concentration in the n-type GaP buffer layer 11 when the light emitting element substrates are manufactured with the melt-back method by using said multi-layer GaP substrates 15 with various S concentrations in the n-type GaP buffer layers 11. The similar relationship for Te is also shown in the same figure.

As shown in the figure, the n-type dopant S contained in the n-type GaP buffer layer 11 is transferred, without a significant reduction in the concentration (approximately down to ½), to the nitrogen-doped n-type GaP layer 13 (light emitting area). On the other hand, the Te concentration in the nitrogen-doped n-type GaP layer 13 is reduced to about 1/50 of the Te concentration in the n-type GaP buffer layer 11. (For example, when the Te concentration in the n-type GaP buffer layer 11 is $2.5 \times 10^{17}$ [atoms/cc], the Te concentration in the nitrogen-doped n-type GaP layer 13 is about $5 \times 10^{15}$ [atoms/cc].) In order to make the total concentration of the n-type dopants in the nitrogen-doped n-type GaP layer 13, i.e. ND, $3 \times 10^{16}$ [atoms/cc] or lower, it is necessary to keep the S concentration in said n-type GaP buffer layer 11 at $5 \times 10^{16}$ [atoms/cc] or lower so that the total concentration of the n-type dopants (for example, a total of the S concentration and the Te concentration) is $5 \times 10^{16}$–$3 \times 10^{17}$ [atoms/cc].

Figure 5:
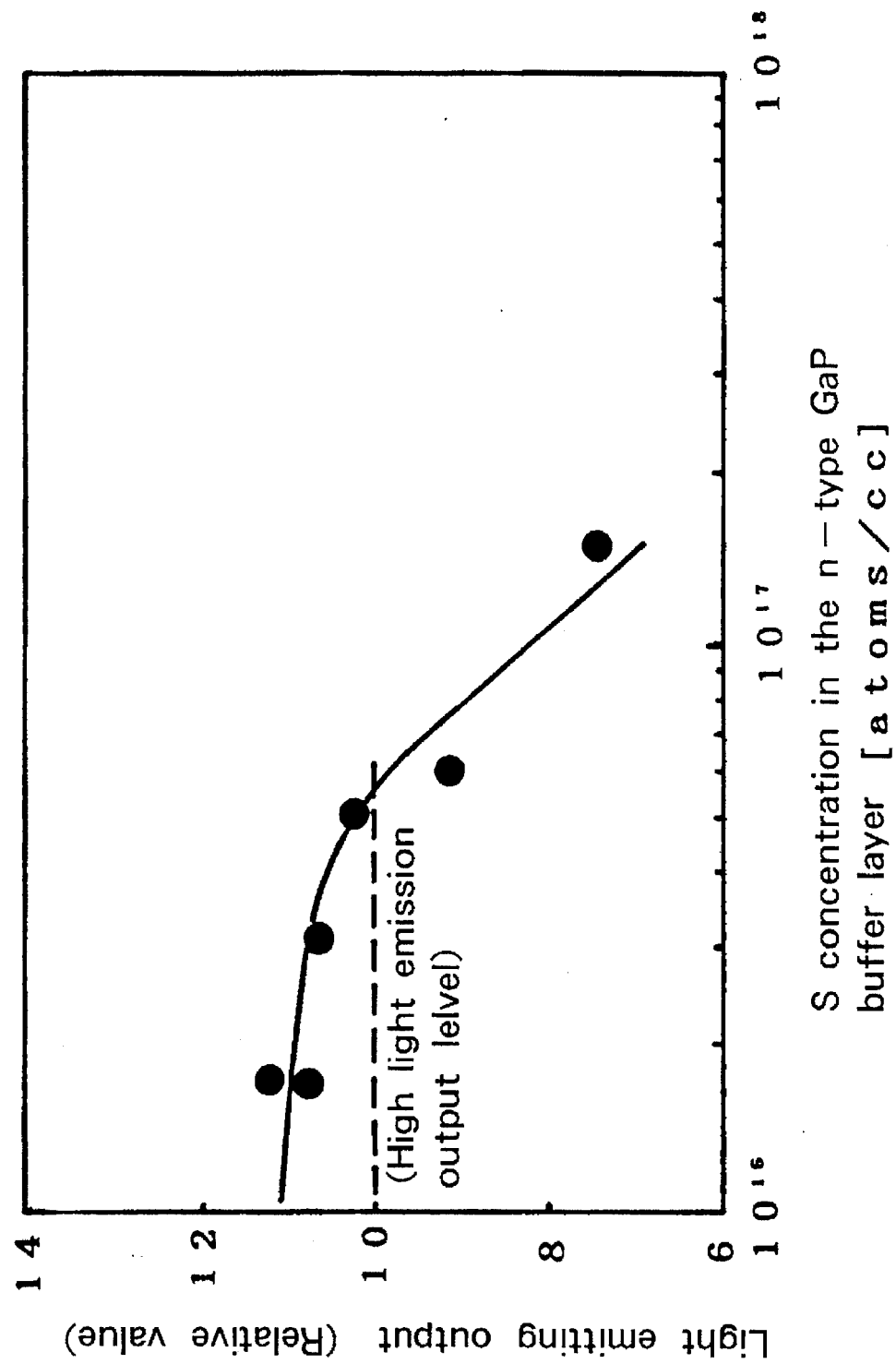
FIG. 5 shows the relationship between the light emission output (relative values) of the light emitting diodes and the S concentrations in the n-type GaP buffer layers when the GaP light emitting element substrates from which these light emitting diodes are made are prepared with the melt-back method by using said multi-layer GaP substrates with various S concentrations in the n-type GaP buffer layers.

FIG. 5 shows the relationship between the light emission output (relative values) of the light emitting diodes and the S concentrations in the n-type GaP buffer layers 11 when the GaP light emitting element substrates from which these light emitting diodes are made are prepared with the melt-back method by using said multi-layer GaP substrates with various S concentrations in the n-type GaP buffer layers 11. As shown in the figure, a green light emitting GaP light emitting diode with a high light emission output (light emission output (relative value) of 10 or more) can be obtained by keeping the S concentration in said n-type GaP buffer layer 11 at $5 \times 10^{16}$ [atoms/cc] or lower.

As described thus far, the effect of this invention lies in that, by using this invention, a GaP light emitting element substrate containing a nitrogen-doped n-type GaP layer with a sufficiently low concentration of n-type dopants can be obtained so that green light emitting GaP light emitting diodes manufactured by using this substrate produce a sufficiently high light emission output.

What is claimed is:

1. A method of manufacturing a GaP light emitting element substrate wherein an n-type GaP buffer layer is formed on an n-type GaP single crystal substrate to prepare a multi-layer GaP substrate, then an n-type GaP layer, a nitrogen doped n-type GaP layer and a p-type GaP layer are layered on said multi-layer GaP substrate by means of liquid phase epitaxial deposition using the melt-back method to dissolve the upper portion of the n-type GaP buffer layer(s), said method of manufacturing a GaP light emitting element substrate being characterized by the sulfur concentration in said n-type GaP buffer layer made to be $5 \times 10^{16}$ atoms/cc or less, and some sulfur is transferred by the melt-back of the n-type GaP buffer layer(s) to the nitrogen doped n-type GaP layer in the concentration of $3 \times 10^{16}$ atoms/cc or lower.

2. A method of manufacturing a GaP light emitting element substrate as described in claim 1, wherein said n-type GaP buffer layer is doped with at least one n-type dopant in addition to said sulfur and the concentration of the n-type dopant(s) in said n-type GaP buffer layer is $5 \times 10^{16}$–$3 \times 10^{17}$ atoms/cc.

* * * * *